United States Patent
Awtar et al.

(10) Patent No.: US 9,200,689 B2
(45) Date of Patent: Dec. 1, 2015

(54) SINGLE-AXIS FLEXURE BEARING CONFIGURATIONS

(75) Inventors: Shorya Awtar, Ann Arbor, MI (US);
Siddharth Sood, Gaithersburg, MD (US); Mohammad Olfatnia, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 728 days.

(21) Appl. No.: 13/586,444

(22) Filed: Aug. 15, 2012

(65) Prior Publication Data

US 2013/0207328 A1   Aug. 15, 2013

Related U.S. Application Data

(60) Provisional application No. 61/523,714, filed on Aug. 15, 2011.

(51) Int. Cl.
*F16F 1/00* (2006.01)
*B81B 3/00* (2006.01)

(52) U.S. Cl.
CPC ............ *F16F 1/00* (2013.01); *B81B 3/0051* (2013.01); *B81B 2201/033* (2013.01)

(58) Field of Classification Search
CPC ........ H02N 1/00; H02N 1/008; B81B 3/0037; B81B 3/0021
See application file for complete search history.

(56) References Cited

U.S. PATENT DOCUMENTS

| | | |
|---|---|---|
| 5,349,855 A | 9/1994 | Bernstein et al. |
| 5,631,514 A | 5/1997 | Garcia et al. |
| 5,998,906 A | 12/1999 | Jerman et al. |
| 6,133,670 A | 10/2000 | Rodgers et al. |
| 6,384,510 B1 | 5/2002 | Grade et al. |
| 6,465,929 B1 | 10/2002 | Levitan et al. |
| 6,541,892 B2 | 4/2003 | Hoen |
| 6,664,707 B2 | 12/2003 | Jerman et al. |
| 6,836,584 B1 | 12/2004 | Jerman et al. |
| 6,882,083 B2 | 4/2005 | Jerman et al. |
| 6,947,188 B2 | 9/2005 | Miles et al. |
| 2005/0052723 A1 | 3/2005 | Wantanabe et al. |
| 2005/0062361 A1 | 3/2005 | Harley et al. |
| 2010/0264777 A1 | 10/2010 | Medhat et al. |

OTHER PUBLICATIONS

J. D. Grade, K. Y. Yasumura, and H. Jerman, "A Drie Comb-Driven Actuator With Large, Stable Deflection Range For Use As An Optical Shutter" IEEE, Tranducers '03, The 12th International Conferenece of Solid State Sensors, Actuators and Microsystems, Boston, June 8-12, 2003, pp. 568-571.
L. J. Ji, Y. Zhu, S. O. R. Moheimani, M. R. Yuce, and IEEE, "A Micromachined 2DOF Nanopositioner with Integrated Capacitive Displacement Sensor," in 2010 Ieee Sensors, pp. 1464-1467.

(Continued)

*Primary Examiner* — Daniel Wiley
(74) *Attorney, Agent, or Firm* — Reising Ethington P.C.

(57) ABSTRACT

Flexure bearing systems and configurations guide translational motion along a single-axis in micro and macro applications such as micro-electro-mechanical system (MEMS) devices including sensors and actuators like electrostatic comb-drive actuators. The flexure bearing systems and configurations described herein provide an improved constraint against movement (i.e., stiffness) of the primary mover in non-motion axes such as a bearing axis.

35 Claims, 12 Drawing Sheets

(56) References Cited

OTHER PUBLICATIONS

D. Mukhopadhyay, J. Dong, E. Pengwang, and P. Ferreira, "A SOI-MEMS-based 3-DOF planar parallel-kinematics nanopositioning stage," Sensors and Actuators a—Physical, vol. 147, pp. 340-351, Sep. 2008.
B. R. De Jong, D. M. Brouwer, H. V. Jansen, M. J. De Boer, T. G. Lammertink, S. Stramigioli, G. J. M. Krijnen, and IEEE, "A planar 3 DOF sample manipulator for nano-scale characterization," in MEMS 2006: 19th IEEE International Conference on Micro Electro Mechanical Systems, Technical Digest, 2006, pp. 750-753.
R. Legtenberg, A. W. Groeneveld, and M. Elwenspoek, "Comb-drive actuators for large displacements," Journal of Micromechanics and Microengineering, vol. 6, pp. 320-329, 1996.
J. B. C. Engelen, L. Abelmann, and M. C. Elwenspoek, "Optimized comb-drive finger shape for shock-resistant actuation," Journal of Micromechanics and Microengineering, vol. 20, Oct. 2010.
B. R. De Jong, D. M. Brouwer, M. J. De Boer, H. V. Jansen, H. Soemers, and G. J. M. Krijnen, "Design and Fabrication of a Planar Three-DOFs MEMS-Based Manipulator," Journal of Microelectromechanical Systems, vol. 19, pp. 1116-1130, 2010.
C. C. Chen and C. Lee, "Design and modeling for comb drive actuator with enlarged static displacement," Sensors and Actuators a—Physical, vol. 115, pp. 530-539, Sep. 2004.
J. D. Grade, H. Jerman, and T. W. Kenny, "Design of large deflection electrostatic actuators," Journal of Microelectromechanical Systems, vol. 12, pp. 335-343, 2003.
J. C. Chiou, C. C. Hung, and C. Y. Lin, "Design, fabrication and actuation of a MEMS-based image stabilizer for photographic cell phone applications," Journal of Micromechanics and Microengineering, vol. 20, Jul. 2010.
C. K. Pang, Y. Lu, C. C. Li, J. Chen, H. Zhu, J. P. Yang, J. Q. Mou, G. X. Guo, B. M. Chen, and T. H. Lee, "Design, fabrication, sensor fusion, and control of a micro X-Y stage media platform for probe-based storage systems," Mechatronics, vol. 19, pp. 1158-1168, Oct. 2009.
J. Y. Dong, D. Mukhopadhyay, and P. M. Ferreira, "Design, fabrication and testing of a silicon-on-insulator (SOI) MEMS parallel kinematics XY stage," Journal of Micromechanics and Microengineering, vol. 17, pp. 1154-1161, Jun. 2007.
C. C. Chen, C. Lee, Y. J. Lai, and W. C. Chen, "Development and application of lateral comb-drive actuator," Japanese Journal of Applied Physics Part 1—Regular Papers Short Notes & Review Papers, vol. 42, pp. 4059-4062, 2003.
J. Dong and P. M. Ferreira, "Electrostatically Actuated Cantilever With SOI-MEMS Parallel Kinematic XY Stage," Journal of Microelectromechanical Systems, vol. 18, pp. 641-651, Jun. 2009.
M. T. K. Hou, G. K. W. Huang, J. Y. Huang, K. M. Liao, R. S. Chen, and J. L. A. Yeh, "Extending displacements of comb drive actuators by adding secondary comb electrodes," Journal of Micromechanics and Microengineering, vol. 16, pp. 684-691, Apr. 2006.
J. C. Chiou, Y. J. Lin, and C. F. Kuo, "Extending the traveling range with a cascade electrostatic comb-drive actuator," Journal of Micromechanics and Microengineering, vol. 18, Jan. 2008.
Y. Xu, N. C. MacDonald, and S. A. Miller, "Integrated Micro-Scanning Tunneling Microscope," Applied Physics Letters, vol. 67, pp. 2305-2307, 1995.
Y. Gerson, S. Krylov, B. Illic, D. Schreiber, and IEEE, "Large displacement low voltage multistable micro actuator," in Mems 2008: 21st Ieee International Conference on Micro Electro Mechanical Systems, Technical Digest, 2008, pp. 463-466.
S. H. Sadat, D. Kamiya, and M. Horie, "Large-Deflection Spiral-Shaped Micromirror Actuator," Journal of Microelectromechanical Systems, vol. 18, pp. 1357-1364, Dec. 2009.
D. M. Brouwer, A. Otten, J. B. C. Engelen, B. Krijnen, and H. M. J. R. Soemers, "Long-range Elastic Guidance Mechanisms for Electrostatic Comb-drive Actuators," in Proceedings of the euspen International Conference, Delft, 2010.
C. H. Kim and Y. K. Kim, "Micro XY-stage using silicon on a glass substrate," Journal of Micromechanics and Microengineenng, vol. 12, pp. 103-107, Mar. 2002.
V. P. Jaecklin, C. Linder, N. F. Derooij, J. M. Moret, R. Bischof, and F. Rudolf, "Novel Polysilicon Comb Actuators for XY-Stages," Ieee Micro Electro Mechanical Systems : An Investigation of Micro Structures, Sensors, Actuators, Machines and Robots, pp. 147-149, 1992.
Y. C. Chen, I. C. M. Chang, R. S. Chen, and M. T. K. Hou, "On the side instability of comb-fingers in MEMS electrostatic devices," Sensors and Actuators a—Physical, vol. 148, pp. 201-210, Nov. 2008.
A. Q. Liu, J. Li, Z. Liu, C. Lu, X. M. Zhang, and M. Y. Wang, "Self-latched micromachined mechanism with large displacement ratio," Journal of Microelectromechanical Systems, vol. 15, pp. 1576-1585, Dec. 2006.
C. H. Kim, H. M. Jeong, J. U. Jeon, and Y. K. Kim, "Silicon micro XY-stage with a large area shuttle and no-etching holes for SPM-based data storage," Journal of Microelectromechanical Systems, vol. 12, pp. 470-478, Aug. 2003.
L. Gu, X. X. Li, H. F. Bao, B. Liu, Y. L. Wang, M. Liu, Z. X. Yang, and B. L. Cheng, "Single-wafer-processed nano-positioning XY-stages with trench-sidewall micromachining technology," Journal of Micromechanics and Microengineering, vol. 16, pp. 1349-1357, Jul. 2006.
D. M. Brouwer, B. R. De Jong, H. Soemers, and J. Van Dijk, "Sub-nanometer stable precision MEMS clamping mechanism maintaining clamp force unpowered for TEM application," Journal of Micromechanics and Microengineering, vol. 16, pp. S7-S12, 2006.
B. Borovic, F. L. Lewis, A. Q. Liu, E. S. Kolesar, and D. Popa, "The lateral instability problem in electrostatic comb drive actuators: modeling and feedback control," Journal of Micromechanics and Microengineering, vol. 16, pp. 1233-1241, Jul. 2006.
G. Y. Zhou and P. Dowd, "Tilted folded-beam suspension for extending the stable travel range of comb-drive actuators," Journal of Micromechanics and Microengineering, vol. 13, pp. 178-183, Mar. 2003.

SINGLE-AXIS FLEXURE BEARING CONFIGURATIONS

CROSS-REFERENCE TO RELATED APPLICATION

This application claims the benefit of U.S. Provisional Application No. 61/523,714 filed Aug. 15, 2011, the entire contents of which are hereby incorporated by reference.

TECHNICAL FIELD

This disclosure relates generally to flexure mechanisms for guiding motion, and specifically to flexure bearing configurations for guiding motion along a single-axis.

BACKGROUND OF THE INVENTION

Flexure mechanisms are commonly used as bearings to provide guided motion. In general, flexure mechanisms move by elastic deformation and therefore are largely free of conventional rolling and sliding joints, friction, and backlash. One type of flexure mechanism is a single-axis flexure bearing. Single-axis flexure bearings are commonly used to guide translational motion along a single-axis. Some general applications where this functionality is utilized include, but are not limited to, micro-electro-mechanical system (MEMS) devices including sensors and actuators; nano-positioning systems used in scanning probe microscopy; ultra-precision motion stages for fine adjustment and alignment; and non-contact macro-scale sensors and actuators. Shortcomings in known single-axis flexure bearings include their somewhat limited range of motion—or stroke or displacement—along the single axis, and their somewhat limited constraint against motion along other axes.

SUMMARY OF THE INVENTION

According to one embodiment, a flexure bearing configuration includes a primary mover, a first flexure connection, a first secondary mover, a second flexure connection, a third flexure connection, a second secondary mover, and a fourth flexure connection. The primary mover is guided for movement along a motion axis, and the first flexure connection is coupled to the primary mover. The first secondary mover is guided for movement along the motion axis and is coupled to the first flexure connection. The second flexure connection is coupled to the first secondary mover and is anchored to a ground. The third flexure connection is coupled to the primary mover. The second secondary mover is guided for movement along the motion axis and is coupled to the third flexure connection. And the fourth flexure connection is coupled to the second secondary mover and is anchored to the ground. During use of the flexure bearing configuration, a displacement along the motion axis of the first secondary mover, of the second secondary mover, or of both the first and second secondary movers, is approximately one-half a displacement along the motion axis of the primary mover. And the displacement of the first secondary mover, the second secondary mover, or of both the first and second secondary movers, remains approximately one-half throughout movement of the primary mover during use of the flexure bearing configuration. The primary mover is free of a direct coupling to a flexure connection that itself is not directly coupled to a secondary mover.

According to another embodiment, a flexure bearing configuration includes a primary mover, a first flexure connection, a first secondary mover, a second flexure connection, a third flexure connection, a second secondary mover, a fourth flexure connection, and a rigid connector. The primary mover is guided for movement along a motion axis. The first flexure connection is coupled to the primary mover. The first secondary mover is guided for movement along the motion axis and is coupled to the first flexure connection. The second flexure connection is coupled to the first secondary mover and is anchored to a ground. The third flexure connection is coupled to the primary mover. The second secondary mover is guided for movement along the motion axis and is coupled to the third flexure connection. The fourth flexure connection is coupled to the second secondary mover and is anchored at the ground. The rigid connector is coupled to the first secondary mover by way of a fifth flexure connection and is coupled to the second secondary mover by way of a sixth flexure connection. And the rigid connector is free of a direct coupling to the primary mover and is free of a direct coupling to the ground.

According to another embodiment, a flexure bearing configuration includes a primary mover, a first flexure connection, a first secondary mover, a second flexure connection, a third flexure connection, a second secondary mover, a fourth flexure connection, and one or more additional secondary mover(s). The primary mover is guided for movement along a motion axis. The first flexure connection is coupled to the primary mover. The first secondary mover is guided for movement along the motion axis and is coupled to the first flexure connection. The second flexure connection is coupled to the first secondary mover and is anchored to a ground. The third flexure connection is coupled to the primary mover. The second secondary mover is guided for movement along the motion axis and is coupled to the third flexure connection. The fourth flexure connection is coupled to the second secondary mover and is anchored to the ground. The one or more additional secondary mover(s) are coupled to the primary mover by way of an additional flexure connection and are anchored to the ground by way of yet another additional flexure connection.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE PREFERRED EMBODIMENTS

Figure 1:
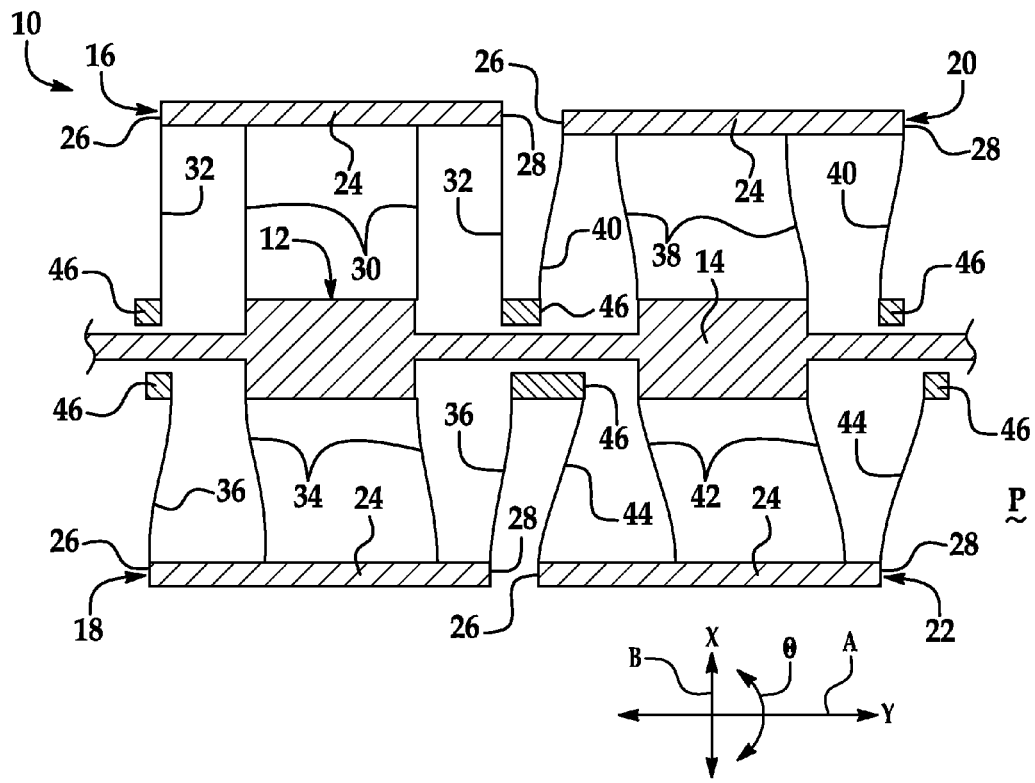
FIG. 1 is a diagrammatic view of a first embodiment of a flexure bearing configuration.

Some of the figures show components with cross-sectional lines; the cross-sectional lines are for illustrative purposes only and are not necessarily meant to indicate actual physical cross-sections, designate materials of the components, relate components to one another, identify plane configurations of the components, or have any other purpose beyond what is described herein.

Referring to the drawings, the figures show numerous embodiments of a flexure bearing system and configuration used to guide translational motion along a single-axis. The flexure bearing configurations can be used in micro and macro applications including, but not limited to, micro-electro-mechanical system (MEMS) devices including MEMS sensors and MEMS actuators such as electrostatic comb-drive actuators; nano-positioning systems that are used in scanning probe microscopy; ultra-precision motion stages for fine adjustment and alignment; and non-contact sensors and actuators such as moving magnet actuators and voice coil actuators. In these applications and others, it is often desirable to increase the stroke or displacement of a primary mover along a motion axis, while simultaneously constraining movement of the primary mover in non-motion axes also known as bearing axes. Even more desirable, though generally difficult to achieve in flexure bearings, is ideal bearing behavior in which infinite movement and zero constraint is provided along the motion axis, and zero movement and infinite constraint is provided in the non-motion axes. Compared to what is previously known, the flexure bearing configurations shown and described herein provide an improved constraint against movement (also called stiffness) in the non-motion axes while maintaining large displacement along the motion axis, and therefore exhibit a more ideal-like bearing behavior. And in certain applications, the flexure bearing configurations provide better performance in terms of stroke, force output, speed, precision, or a combination of these.

In some of the embodiments of the flexure bearing configurations shown and described herein, the improvements are a result of controlling secondary motion stages along the motion axis in different ways. For example, displacements along the motion axis of one or more secondary motion stages are controlled to be a fraction of a displacement along the motion axis of a primary motion stage. Moreover, the fraction relationship between the secondary and primary motion stages can be substantially maintained as a constant throughout their respective range of motions in other words, the value of the fraction does not substantially deviate during operation and movement of the flexure bearing configuration. In one or more embodiments described herein, the displacement along the motion axis of the secondary motion stage is approximately one-half that of the primary motion stage, and remains substantially one-half throughout movement of the secondary and primary motion stages.

In FIG. 1, and as used herein, a motion direction refers to fore and aft directions along a motion axis A with respect to a ground. Movement of the primary motion stage in the motion direction is guided and facilitated by the flexure bearing configurations shown and described, and is also referred to as the y-direction. A bearing direction, on the other hand, refers to upward and downward directions along a bearing axis B with respect to a ground, which is orthogonal to the motion axis A. This is also referred to as the x-direction. The fore and aft and upward and downward directions are with reference to the orientations shown in the figures. Another bearing direction refers to rotational directions θ about a z-axis relative to the x- and y-axes. Movements in the bearing direction are generally undesirable and are sometimes called error motions or parasitic motions. Movement of the primary motion stage in the bearing directions is meant to be substantially constrained by the flexure bearing configurations.

The flexure bearing configurations are shown and described in an example electrostatic comb-drive actuator application. But again, other applications and even other comb-drive actuator examples are possible. In the electrostatic comb-drive actuator example, the flexure bearing configurations can reside on a silicon wafer substrate and can be formed via a micro-fabrication process such as photolithography; of course, other formation processes are possible. The flexure bearing configurations can reside substantially on a single plane of the substrate, or can have out-of-plane components that reside in different planes. In general, and referring now to FIG. 22, the example comb-drive actuator includes a moveable first comb C1 with a first set of fingers F1, and a stationary second comb C2 with a second set of fingers F2. When a voltage is applied across the first and second combs C1, C2, a capacitance is generated among the individual fingers of the first and second combs, and a resulting attractive force causes the first comb to move toward the second comb to increase the interdigitation among the fingers. One challenge in comb-drive actuators, however, is a behavior known as sideways snap-in instability. When this occurs, the moveable first comb deflects in a sideways or other non-motion axis direction and makes contact with the stationary second comb. Comb-drive actuators are generally more susceptible to snap-in instability at increased displacements, and thus the snap-in behavior can limit the maximum displacement of the comb-drive actuators. In the comb-drive actuator example, the flexure bearing configurations shown and described guide and facilitate movement of the first comb in the motion direction, and help inhibit snap-in instability in the bearing direction.

Referring to FIG. 1, a first embodiment of a flexure bearing configuration 10 includes a primary mover 12, several secondary movers, and numerous flexure connections coupled to the movers and between the movers. In the first embodiment, the flexure bearing configuration 10 and its components are generally located in a single plane P; in other embodiments, for example, components such as the flexure connections could have an out-of-plane configuration in which the connections could be stacked over one another in different planes along a z-axis (the z-axis being in reference to the x- and y-axes of FIG. 1) with the correspondingly stacked primary movers fused together; other out-of-plane configurations such as out-of-plane secondary movers are possible. FIG. 1 shows the flexure bearing configuration 10 in an unactuated and resting state in which the configuration is not being actuated to move. The primary mover 12 is guided for movement by the flexure connections and, upon actuation, can move translationally in the fore and aft motion directions along the motion axis A. In the comb-drive actuator application, the primary mover 12 is called a shuttle and can be a unitary extension of the moveable first comb. Movement of the primary mover 12 constitutes a primary motion stage of the flexure bearing configuration 10. In FIG. 1, the primary mover 12 has a one-piece body 14 with coupling points to the flexure connections along its motion-directional-extent; in other embodiments, the primary mover can have various designs and shapes, mostly dictated by the particular applications and by other components of the particular flexure bearing configuration. The primary mover 12 is free of a direct coupling to a flexure connection that itself is not directly coupled to a secondary mover. In other words, all of the flexure connections directly coupled to the primary mover 12 are also directly coupled to a secondary mover. By direct or directly, as used herein, it is meant without any intervening or intermediate components such as a connector; for example, direct couplings are shown in FIG. 1 between the primary mover 12 and the secondary movers via the respective flexure connections, and direct couplings are also shown in other figures.

In this embodiment, there are a total of four secondary movers coupled to the primary mover 12: a first secondary mover 16, a second secondary mover 18, a third secondary mover 20, and a fourth secondary mover 22. In other embodiments, there could be three or more secondary movers. The secondary movers are guided for movement by the flexure connections respectively coupled to them, and can move translationally in the fore and aft motion directions along the motion axis A, and can also move along the bearing axis B. In use, the secondary movers are not chiefly actuated upon, and instead move in response to actuation of the primary mover 12 or have derivative motion to that of the primary mover. Movement of the secondary movers thus constitutes secondary motion stages of the flexure bearing configuration 10. In FIG. 1, each of the secondary movers has a one-piece body 24 with a first end 26 and a second end 28; like the primary mover 12, the secondary movers can have various designs and shapes that are mostly dictated by the particular application and by other components of the particular flexure bearing configuration. A longitudinal axis, or greatest dimension, of the bodies 24 are arranged generally geometrically parallel to the motion axis A and generally geometrically parallel to the primary mover 12 when the secondary movers are in a static state and are not moving in response to movement of the primary mover 12.

In the first embodiment, the flexure connections are in the form of flexure beams, but could be in the form of other flexure structures not shown in the figures. There are a total of eight pairs of flexure beams: a first pair of flexure beams 30, a second pair of flexure beams 32, a third pair of flexure beams 34, a fourth pair of flexure beams 36, a fifth pair of flexure beams 38, a sixth pair of flexure beams 40, a seventh pair of flexure beams 42, and an eighth pair of flexure beams 44. Each pair includes a first and second individual flexure beam, and in this particular embodiment the individual flexure beams have a uniform thickness along their entire extents. In general, flexure beams flex and elastically deform when moved, and are free of conventional joints, friction, and backlash. The flexure beams in FIG. 1 guide and facilitate the movements of the primary mover 12 and the secondary movers 16, 18, 20, 22. Individual flexure beams of the first, third, fifth, and seventh pairs of flexure beams 30, 34, 38, 42 are coupled between the primary mover 12 and the respective secondary mover 16, 18, 20, 22. And individual flexure beams of the second, fourth, sixth, and eighth pairs of flexure beams 32, 36, 40, 44 are coupled between the respective secondary mover 16, 18, 20, 22 and a ground 46. The ground 46 anchors movement of the respective flexure beams and does not itself move during actuation of the primary mover 12. The ground 46 can be a portion of the base substrate.

In the static state, the first and second pairs of flexure beams 30, 32 have a geometrically straight design. That is, the flexure beams 30, 32 are linear along their entire extent, and are directed along and parallel to the bearing axis B orthogonal to the motion direction. In this unflexed position, the individual flexure beams of the pairs 30, 32 provide their maximum constraint against movement of the primary mover 12 along the bearing axis B. The third, fourth, fifth, sixth, seventh, and eighth pair of flexure beams 34, 36, 38, 40, 42, 44, on the other hand, have a pre-bent design. The pre-bent individual flexure beams of the pairs 34, 36, 38, 40, 42, 44 each have one or more bends formed along their extent when in the resting state and before being flexed by movement upon actuation of the primary mover 12. The pre-bent design is formed by modeling the bends based on the natural flexing and deformation that occurs to a geometrically straight beam when the straight beam is moved in use; in other words, a pre-bent beam is designed to have a substantially exact resemblance to a straight beam at a particular point in the midst of the straight beam's movement. An individual pre-bent flexure beam provides its maximum constraint against movement along the bearing axis B when the beam is flexed, is geometrically straight, and is directed orthogonal to the motion direction. In the first embodiment of FIG. 1, the pre-bent individual flexure beams of the pairs 34, 36, 38, 40, 42, 44 each have a slightly different degree of bend formed in them. The different bends are formed so that at virtually any given position of the primary mover 12 along the motion axis A, one or more of the flexure beams are flexed geometrically straight or close to geometrically straight. In this way, the flexure bearing configuration 10 provides improved constraint against movement along the bearing axis B at different displacements along the motion axis A. All of the flexure beams are arranged geometrically nonparallel to the motion axis A and to the primary mover 12.

Figure 2:
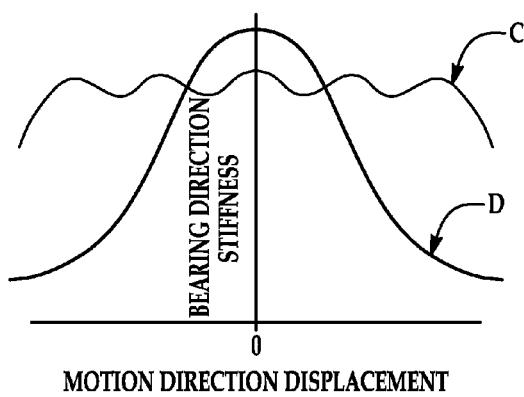
FIG. 2 is a graph showing displacement and stiffness performance of the flexure bearing configuration of FIG. 1 versus that of a known flexure bearing configuration.

In use in the first embodiment, when the primary mover 12 is actuated and moves, the first secondary mover 16 and the third secondary mover 20 move in one of the fore or aft directions along the motion axis A, and the second secondary mover 18 and the fourth secondary mover 22 also move in one of the fore or aft directions. FIG. 2 is a graph that shows the performance of the flexure bearing configuration 10 (marked by arrow C) compared to that of a known flexure bearing configuration (marked by arrow D). FIG. 2 is the result of finite element analysis (FEA). The horizontal axis represents the displacements along the motion axis A of the primary mover 12, and the vertical axis represents the magnitude of constraint, or stiffness, against movement of the primary mover along the bearing axis B. The known flexure bearing configuration has a primary mover coupled to a first secondary mover via a pair of flexure beams, with another pair of flexure beams coupled to the first secondary mover and anchored to a ground; further, a second secondary mover is coupled to the primary mover on an opposite side of the primary mover via a pair of flexure beams, with another pair of flexure beams coupled to the second secondary mover and anchored to the ground; and, all of the flexure beams have a geometrically straight design; this known flexure bearing configuration is a double-parallelogram-double-parallelogram (DP-DP) configuration. Referring to the graph, the flexure bearing configuration 10 exhibits a suitable constraint against movement along the bearing axis B over a greater range of displacements compared to the DP-DP configuration. The numerous maximum peaks of constraint along the bearing axis B of the configuration 10 are due to the different pre-bent flexure beams being flexed geometrically straight or close to geometrically straight. Though the pre-bending can result in an overall decreased maximum peak value, it can be suitable for a particular application because the peaks are maintained over an increased range of displacements. Comparatively, the constraint against movement along the bearing axis B of the DP-DP configuration worsens sharply at increased displacements. Moreover, in some applications like the electrostatic comb-drive actuator application, the primary mover 12 is subjected to forces and displacements in the bearing directions at these increased displacements (e.g., the attractive force between the first and second combs), and therefore constraint against movement can be needed at these displacements.

Figure 4:
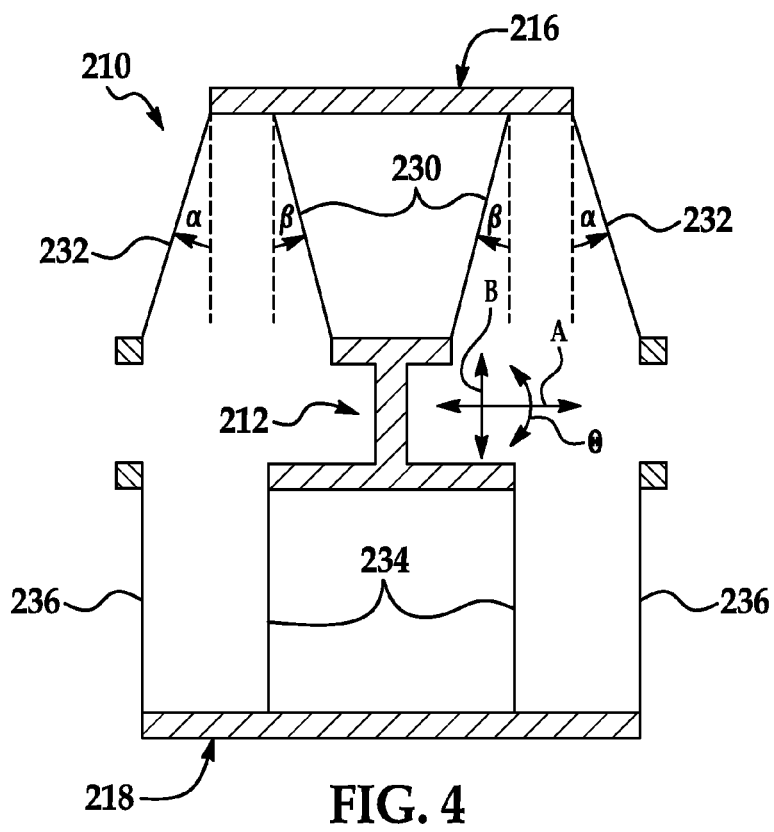
FIG. 4 is a diagrammatic view of a third embodiment of a flexure bearing configuration.
Figure 21:
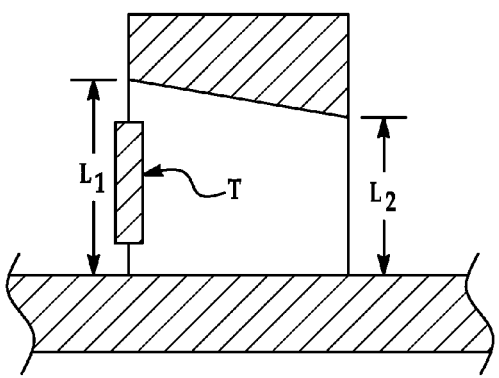
FIG. 21 is a diagrammatic view of flexure beams having different lengths with respect to each other and having different variations with respect to each other.

Alternatives to the first embodiment of the flexure bearing configuration 10 are possible by incorporating one or more of the following exemplary modifications. In a first modification, the first secondary mover 16 and the third secondary mover 20 could be coupled together via one or more individual flexure beams or via one or more rigid connectors; this would join their movements. Likewise, in a second modification, the second secondary mover 18 and the fourth secondary mover 22 could be coupled together via one or more individual flexure beams or via one or more rigid connectors; this would join their movements. In a third modification, the number of secondary movers could be increased as well as the number of corresponding flexure beams in order to accommodate the couplings to the primary mover and ground; the additional secondary movers and flexure beams could have an out-of-plane configuration, and would further maintain the maximum peaks of the graph of FIG. 2 over an even more increased range of displacements. In a fourth modification, the flexure beams extending from one of the secondary movers could have a tilted design in which the flexure beams are geometrically straight along their extents but are not directed orthogonal to the motion direction and instead are directed at a non-orthogonal angle to the motion direction; one example of a tilted design is shown in FIG. 4 and is subsequently described. In a fifth modification, the number of individual flexure beams could be increased; for example, three or four individual flexure beams could be coupled between the primary mover and one of the secondary movers; this modification could improve constraint against movement in the bearing direction, while keeping constraint against movement in the motion direction at suitable levels for particular applications. In a sixth modification, the shape of individual flexure beams could be varied along their length extents; for example, the width of a flexure beam could be narrower at its proximal end near its coupling point to the primary mover, the width of a flexure beam could be narrower at its distal end near its coupling to the respective secondary mover; this modification is shown in FIG. 21 by flexure beam T; this modification would result in a flexure beam that is compliant at its distal ends but is rigid in between and could improve constraint against movement in the bearing direction (i.e., stiffness). And, in a seventh modification, the lengths of individual flexure beams in a pair of flexure beams could differ; for example, referring to FIG. 21, one of the individual flexure beams of the first pair could have a length $L_1$, and the other individual flexure beam of the first pair could have a length $L_2$, and $L_1$ could have a greater value than $L_2$.

Figure 3:
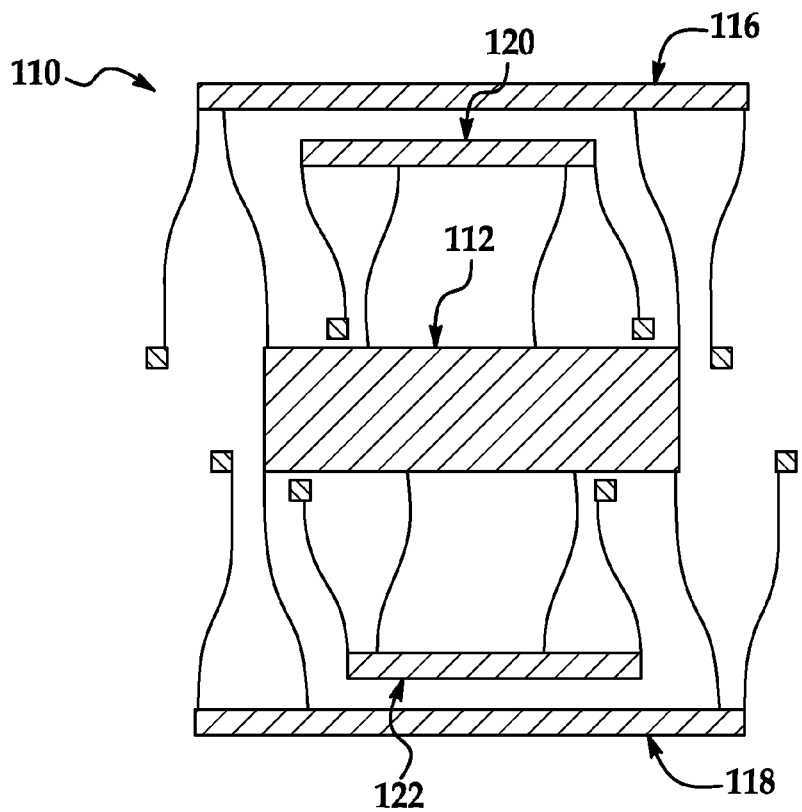
FIG. 3 is a diagrammatic view of a second embodiment of a flexure bearing configuration.

FIG. 3 shows a second embodiment of a flexure bearing configuration 110. The flexure bearing configuration 110 is similar in some ways to the flexure bearing configuration 10 of the first embodiment, and descriptions of these similarities will not necessarily be repeated for the second embodiment.

In this embodiment, secondary movers of the flexure bearing configuration 110 are arranged differently than those of the first embodiment. In general, the arrangement of the flexure bearing configuration 110 is more compact in size than that of the first embodiment, which may be desirable in particular applications. The flexure bearing configuration 110 has a first secondary mover 116 with a greater motion-directional-dimension than that of a third secondary mover 120. The first secondary mover 116 is located above the third secondary mover and farther away from a primary mover 112 when measured along the bearing axis B. Likewise, a second secondary mover 118 has a greater motion-directional-dimension than that of a fourth secondary mover 122, and is located below the fourth secondary mover and farther away from the primary mover 112 when measured along the bearing axis B. In this embodiment, all of the pairs of flexure beams have a pre-bent design as previously described. Furthermore, alternatives to the second embodiment of the flexure bearing configuration 110 are possible by incorporating one or more of the first through seventh modifications described above for the first embodiment.

FIG. 4 shows a third embodiment of a flexure bearing configuration 210. The flexure bearing configuration 210 is similar in some ways to the flexure bearing configuration 10 of the first embodiment, and descriptions of these similarities will not necessarily be repeated for the third embodiment.

Figure 5:
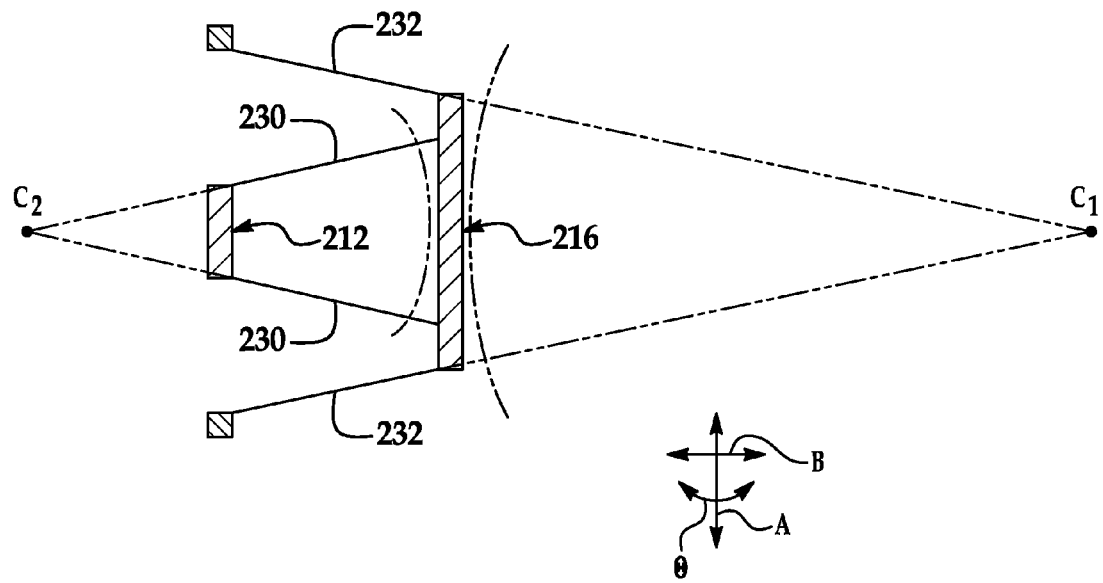
FIG. 5 shows a part of the flexure bearing configuration of FIG. 4.
Figure 6:
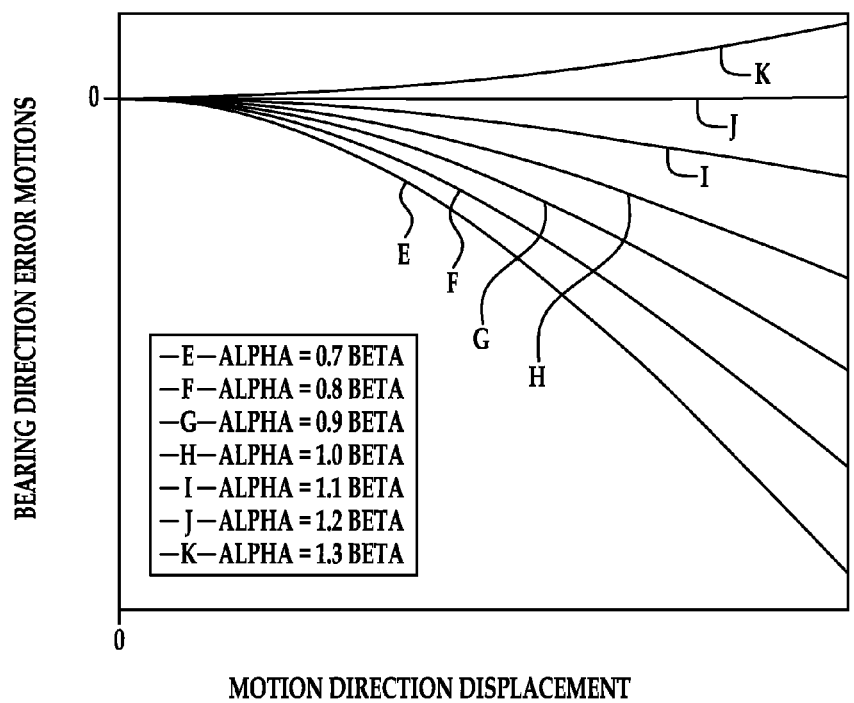
FIG. 6 is a graph showing error motions relative to displacement of the flexure bearing configuration of FIG. 4.

In this embodiment, a first and second pair of flexure beams 230, 232 have a tilted design, and a third and fourth pair of flexure beams 234, 236 have a geometrically straight design. In the tilted design, the individual flexure beams of the first pair 230 define a first angle f3 with respect to the bearing axis B, and the individual flexure beams of the second pair 232 define a second angle α with respect to the bearing axis B. The individual flexure beams of the first pair 230 are arranged geometrically nonparallel relative to each other, and the individual flexure beams of the second pair 232 are arranged geometrically nonparallel relative to each other. Movement in the secondary motion stage is controlled by the tilted design and by the first and second angles β, α. In use, the tilted first and second pair of flexure beams 230, 232 can limit movement and displacement of the first and second secondary movers 216, 218, and the third and fourth pair of flexure beams 234, 236 can constrain rotation directional movement θ of a primary mover 212 close to zero. The tilted first and second pairs of flexure beams 230, 232 are isolated in FIG. 5 in order to describe movement of the first secondary mover 216. The first and second angles β, α can be set to establish a first virtual instantaneous center point of rotation $C_1$ of the secondary motion stage and to establish a second virtual instantaneous center point of rotation $C_2$ of the secondary motion stage. The angles β, α can be set to permit a predetermined displacement of the primary mover 212 for a given application, and to control movement of the secondary motion stage by limiting displacement movement of the first secondary mover 216 to be approximately one-half that of the primary mover 212. The displacement movement of the second secondary mover 218 can also be approximately one-half that of the primary mover 212 and to remain approximately one-half throughout movement of the primary and secondary motion stages. FIG. 6 is a graph that shows parasitic error motions—or movements in the bearing direction—relative to the motion direction displacement of the flexure bearing configuration 210 for certain first and second angle β (beta), α (alpha) relationships; FIG. 6 is the result of FEA. For example, for a relationship E in which the second angle α is equal to 0.7 times (×) the first angle β, a parasitic error motion occurs with greater magnitude than that of a relationship J in which the second angle α is equal to 1.2 times (×) the first angle β. Indeed, the relationship J exhibits substantially small, close to zero parasitic error motions for the motion direction displacements shown in the graph.

Figure 7:
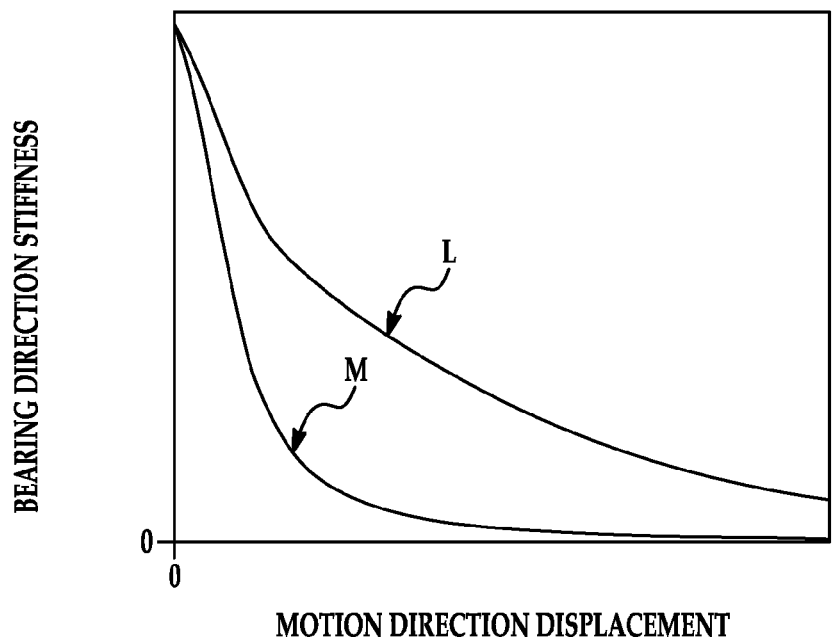
FIG. 7 is a graph showing displacement and stiffness performance of the flexure bearing configuration of FIG. 4 versus that of a known flexure bearing configuration.
Figure 8:
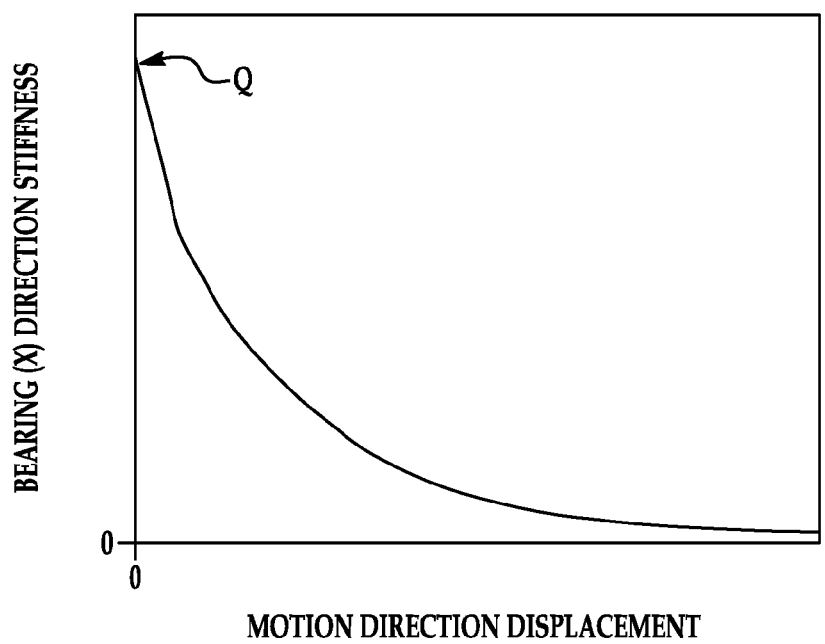
FIG. 8 is a graph showing displacement and stiffness performance of the flexure bearing configuration of FIG. 4.
Figure 9:
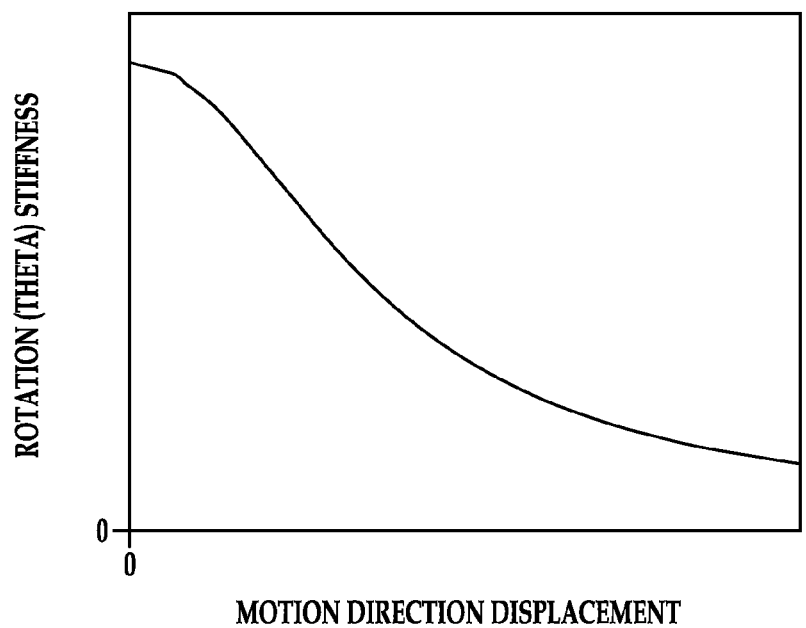
FIG. 9 is a graph showing displacement and rotational (theta) stiffness performance of the flexure bearing configuration of FIG. 4.

FIG. 7 is a graph that shows the performance of the flexure bearing configuration 210 (marked by arrow L) compared to that of the known DP-DP configuration previously described (marked by arrow M). The horizontal axis represents the displacements along the motion axis A of the primary mover 212, and the vertical axis represents the magnitude of constraint (i.e., stiffness) against movement of the primary mover along the bearing axis B. As shown, the flexure bearing configuration 210 exhibits a greater constraint against movement along the bearing axis B over a greater range of displacements compared to the DP-DP configuration, while the constraint against movement along the bearing axis B of the DP-DP configuration worsens sharply at increased displacements. FIG. 8 is a graph that shows the performance of the flexure bearing configuration 210, where the horizontal axis represents the displacements along the motion axis A of the primary mover 212, and the vertical axis represents the magnitude of constraint against movement of the primary mover along the bearing axis B. And FIG. 9 is a graph that shows the performance of the flexure bearing configuration 210, where the horizontal axis represents the displacements along the motion axis A of the primary mover 212, and the vertical axis represents the magnitude of constraint against rotation directional movement θ of the primary mover. FIGS. 7-9 are the result of FEA.

In use, the flexure bearing configuration 210 can suitably move along the motion axis A in both the fore and aft motion directions—that is, it can have suitable bi-directional translational movement. Further, the arrangement of the flexure bearing configuration 210 is more compact in size than that of the first embodiment, which can facilitate formation processes and is desired in certain applications. The primary mover 212 is also more compact in size and has a lower mass compared to the primary mover of the first embodiment. Keeping the mass of the primary mover to a minimum can provide improved dynamic performance of the mover during use of the flexure bearing configuration. Furthermore, alternatives to the third embodiment of the flexure bearing configuration 210 are possible by incorporating one or more of the fifth through seventh modifications described above for the first embodiment. And, in further alternatives, the first and second pair of flexure beams could have a pre-bent design instead of the tilted design shown in FIG. 4, or the third and fourth pair of flexure beams could have a pre-bent design instead of the geometrically straight design shown in FIG. 4.

Figure 10:
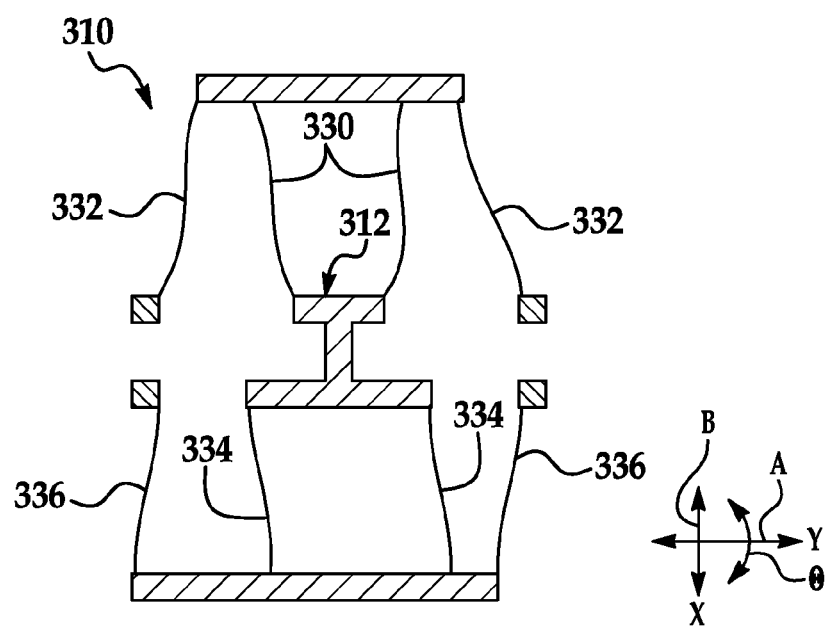
FIG. 10 is a diagrammatic view of a fourth embodiment of a flexure bearing configuration.

FIG. 10 shows a fourth embodiment of a flexure bearing configuration 310. The flexure bearing configuration 310 is similar in some ways to the flexure bearing configuration 210 of the third embodiment, and descriptions of these similarities will not necessarily be repeated for the fourth embodiment. In this embodiment, a first and second pair of flexure beams 330, 332 have a combined tilted and pre-bent design, and a third and fourth pair of flexure beams 334, 336 have a pre-bent design. As previously described, depending on the exact degree of pre-bending formed in the individual flexure beams, the maximum constraint against movement of a primary mover 312 along the bearing axis B can be shifted to a desired motion direction displacement and can be maintained over an increased range of displacements. Referring back to the graph of FIG. 8, this can shift the maximum peak Q of the line to the right of the vertical axis, and can flatten out or extend the maximum peak of the line along the horizontal axis.

Figure 11:
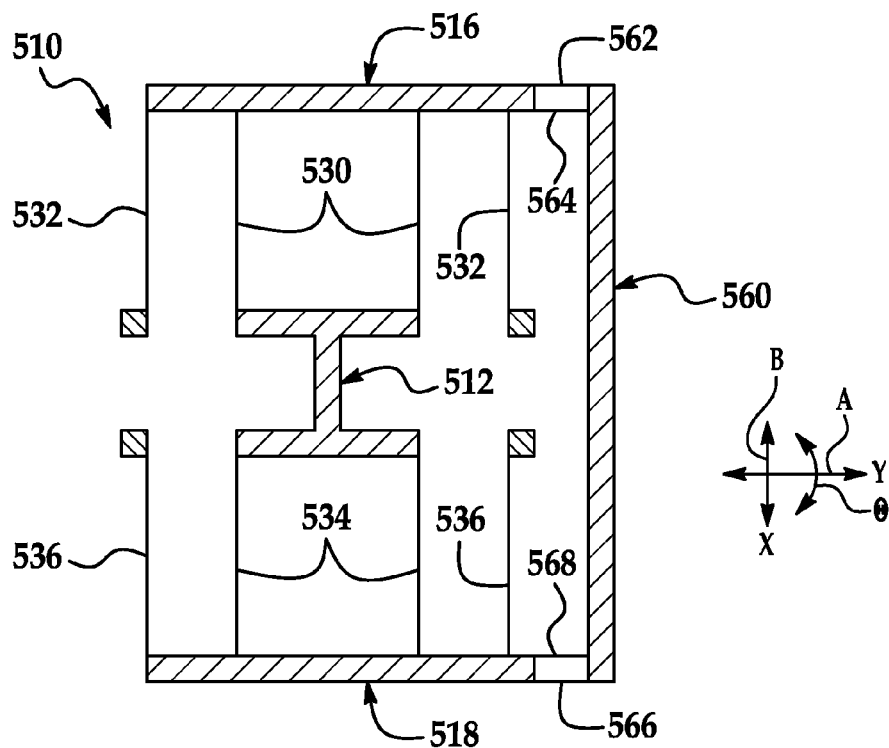
FIG. 11 is a diagrammatic view of a fifth embodiment of a flexure bearing configuration.

FIG. 11 shows a fifth embodiment of a flexure bearing configuration 510. The flexure bearing configuration 510 is similar in some ways to the flexure bearing configuration 10 of the first embodiment, and descriptions of these similarities will not necessarily be repeated for the fifth embodiment.

Figure 12:
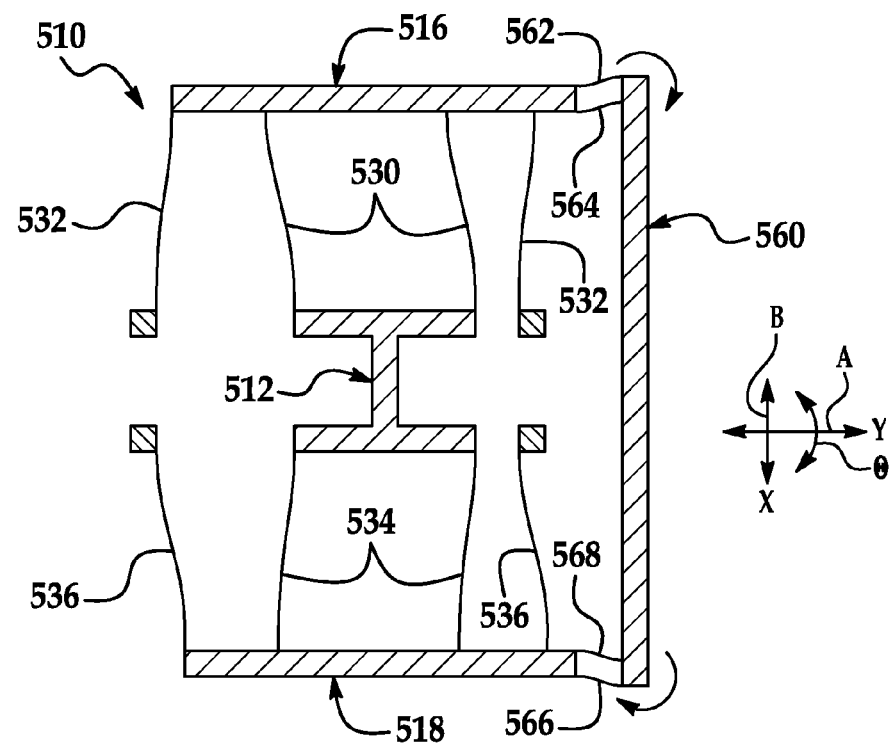
FIG. 12 is a diagrammatic view of the flexure bearing configuration of FIG. 11, showing the flexure bearing configuration in use.

FIG. 11 shows the flexure bearing configuration 510 in a resting state, while FIG. 12 shows the flexure bearing configuration in an actuated state in the midst of movement action. Referring to both of the figures, in this embodiment a first and second pair of flexure beams 530, 532 have a geometrically straight design, and a third and fourth pair of flexure beams 534, 536 also have a geometrically straight design. A rigid connector 560 is coupled between a first secondary mover 516 and a second secondary mover 518, and joins their respective secondary motion stages. The connector 560 is not itself directly anchored to a ground and is not connected to a ground via a single flexure connection, and is free to move during actuation and movement of a primary mover 512. Further, the connector 560 is free of a direct coupling to the primary mover 512 and is free of a direct coupling to ground. The connector 560 is coupled to the first secondary mover 516 at one end via a first individual flexure beam 562 and via a second individual flexure beam 564, and is coupled to the second secondary mover 518 at its other end via a third individual flexure beam 566 and via a fourth individual flexure beam 568. Other couplings to the secondary movers are possible including, for example, increasing the number of individual flexure beams to three or four beams. The flexure beams 562, 564, 566, 568 generally have a geometrically straight design, but could also have a pre-bent design. Furthermore, the flexure beams 562, 564, 566, and 568 have a length sufficient to permit free movement of the first and second secondary movers 516, 518 along the bearing axis B and that does not substantially constrain movement of the first and second secondary movers along the bearing axis that can otherwise occur upon movement of the primary mover 512. The exact shape (i.e., uniform thickness versus variable thickness), geometry (i.e., straight versus pre-bent), dimensions of the individual flexure beams 562, 564, 566, 568, and spacing between individual flexure beams can vary among different applications. For example, making the flexure beams thicker and decreasing their length would improve the constraint against movement of the primary mover in the bearing direction, but could also increase the motion direction stiffness. Rather, the width, length, shape, and geometry of these flexure beams should be optimized to provide the desired improvement in constraint against movement in the bearing direction, while reducing or maintaining the stiffness in the motion direction. And, like the seventh modification previously described, the lengths of the individual flexures beams 562, 564, 566 and 568, could differ with respect to one another.

The connector 560 and the flexure beams 562, 564, 566, 568 join movement in the motion direction of the first and second secondary movers 516, 518 upon actuation and movement of the primary mover 512. The secondary motion stages of the movers 516, 518 thus move together in the same fore or aft motion direction, and the displacement along the motion axis of the secondary motion stages is approximately one-half that of the primary motion stage and remains substantially one-half throughout movement of the secondary and primary motion stages even when the primary mover is loaded in the bearing direction B. As a result, in use, the flexure bearing configuration 510 exhibits an improved and suitable constraint against movement of the primary mover 512 along the bearing axis B and over a greater range of displacements. Indeed, even when the primary mover 512 is loaded and subjected to forces in the bearing direction at increased motion direction displacements, the flexure bearing configuration 510 maintains its improved and suitable constraint against movement in the bearing direction. The connector 560 and the flexure beams 562, 564, 566, 568, however, do not substantially join movement of the first and second secondary movers 516, 518 along the bearing axis B. Doing so could increase resistance against movement of the primary mover 512 in the motion direction and is therefore undesirable in certain applications. Instead, the flexure beams 562, 564, 566, 568 permit an acceptable and suitable amount of movement along the bearing axis B for the secondary motion stages of the first and second secondary movers 516, 518. In this embodiment, the first and second secondary movers 516, 518 can move in opposite downward and upward directions along the bearing axis B, while concurrently they can move in the same fore or aft motion direction and over the same motion direction displacement. And, apart from its coupling to the flexure beams 530, 534, the primary mover 512 has no direct coupling to a connector like the rigid connector 560.

Figure 13:
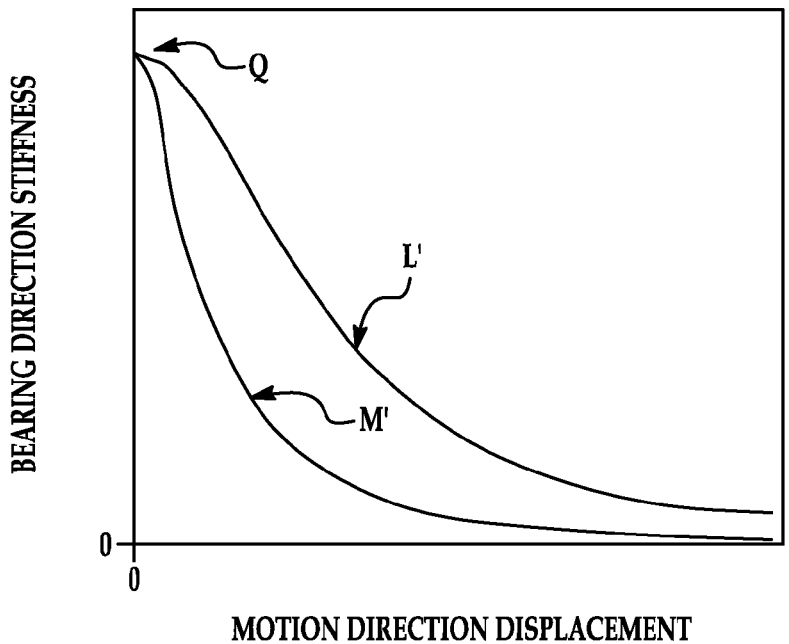
FIG. 13 is a graph showing motion direction displacement and bearing direction stiffness performance of the flexure bearing configuration of FIG. 11.
Figure 14:
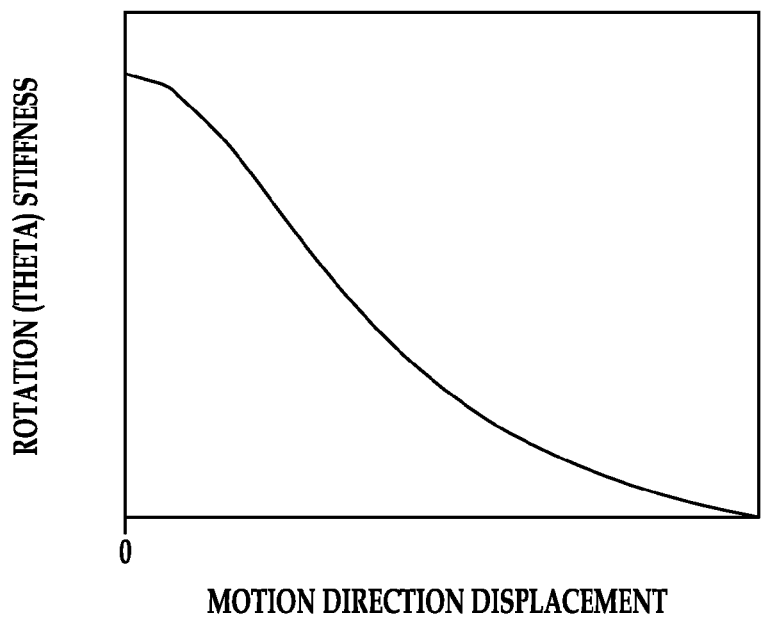
FIG. 14 is a graph showing motion direction displacement and rotational (theta) stiffness performance of the flexure bearing configuration of FIG. 11.
Figure 15:
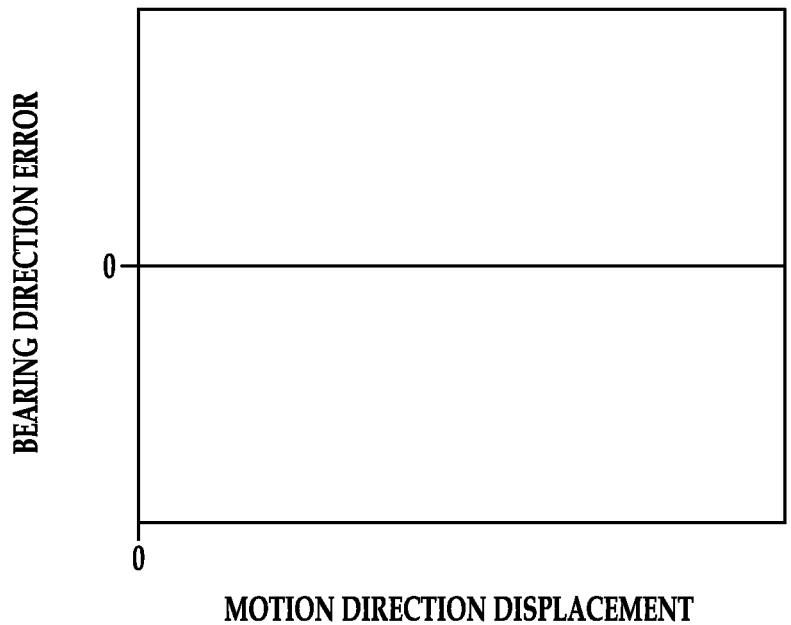
FIG. 15 is a graph showing error motions relative to displacement of the flexure bearing configuration of FIG. 11.
Figure 16:
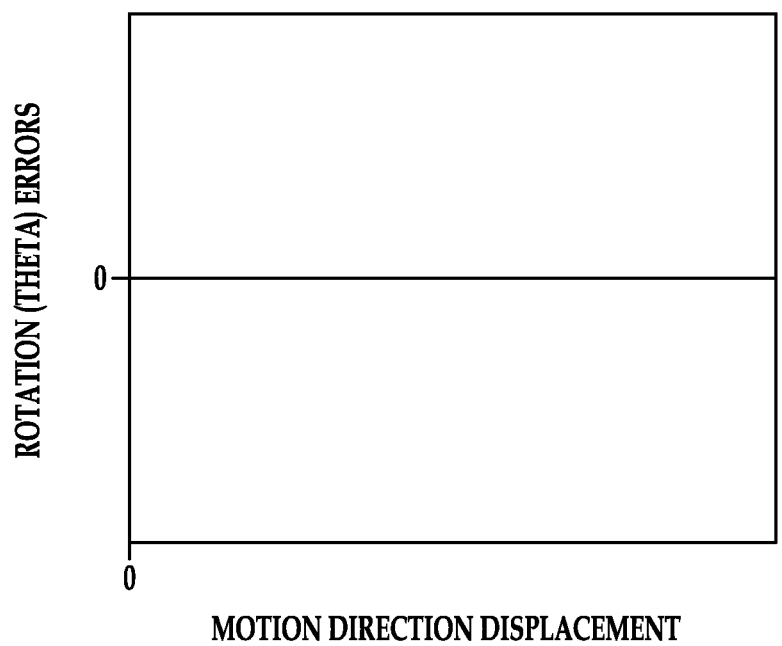
FIG. 16 is a graph showing error motions relative to displacement of the flexure bearing configuration of FIG. 11.

FIG. 13 is a graph that shows the performance of the flexure bearing configuration 510 (marked by arrow L') of the fifth embodiment compared to that of the known DP-DP configuration previously described (marked by arrow M'), where the horizontal axis represents the displacements along the motion axis A of the primary mover 512, and the vertical axis represents the magnitude of constraint against movement of the primary mover along the bearing axis B. FIG. 14 is a graph that shows the performance of the flexure bearing configuration 510, where the horizontal axis represents the stroke displacements along the motion axis A of the primary mover 512, and the vertical axis represents the magnitude of constraint against rotation directional movement θ of the primary mover. FIG. 15 is a graph that shows bearing direction error—or movements along the bearing axis B—relative to the motion direction displacement of the primary mover 512. As shown, the primary mover 512 exhibits zero bearing direction error movements for the motion direction displacements plotted in the graph. And FIG. 16 is a graph that shows rotation errors—or movements in the rotational direction θ—relative to the motion direction displacement of the primary mover 512. As shown, the primary mover 512 exhibits zero rotation error movements for the motion direction displacements plotted in the graph. The graphs of FIGS. 13-16 are the results of FEA.

Alternatives to the fifth embodiment of the flexure bearing configuration 510 are possible by incorporating one or more of the third, fifth, sixth, and seventh modifications described above for the first embodiment. Further alternatives include incorporating the connector 560 and the flexure beams 562, 564, 566, 568 into the first embodiment of FIG. 1, where the connector could be coupled between the first and second secondary movers, could be coupled between the third and fourth secondary movers, or both.

Figure 17:
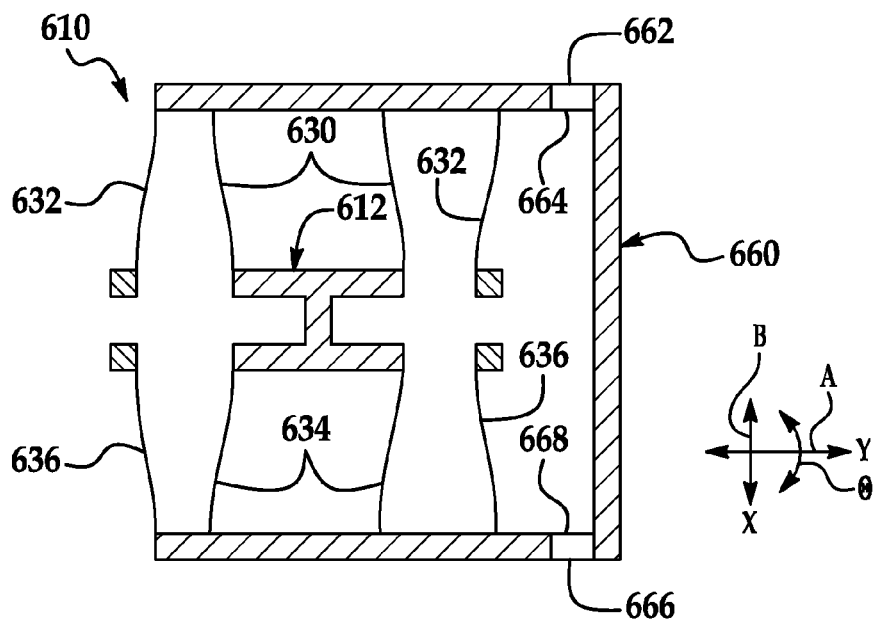
FIG. 17 is a diagrammatic view of a sixth embodiment of a flexure bearing configuration.

FIG. 17 shows a sixth embodiment of a flexure bearing configuration 610. The flexure bearing configuration 610 is similar in some ways to the flexure bearing configuration 510 of the fifth embodiment, and descriptions of these similarities will not necessarily be repeated for the sixth embodiment. Furthermore, potential modifications to the sixth embodiments are the same as those for the fifth embodiment. In this embodiment, a first and second pair of flexure beams 630, 632 have a pre-bent design, and a third and fourth pair of flexure beams 634, 636 also have a pre-bent design. As previously described, depending on the exact degree of pre-bending formed in the individual flexure beams, the maximum constraint against movement of a primary mover 612 along the bearing axis B can be shifted to a desired motion direction displacement and can be maintained over an increased range of displacements. Referring back to the graph of FIG. 13, this can shift the maximum peak Q of the line to the right of the vertical axis. In this embodiment, like that of the fifth embodiment, a rigid connector 660 is provided, and flexure beams 662, 664, 666, 668, have a geometrically straight design. Imparting the pre-bent design to the flexure beams can augment the performance improvements already provided by the rigid connector 660, which may be desirable in certain applications.

Figure 18:
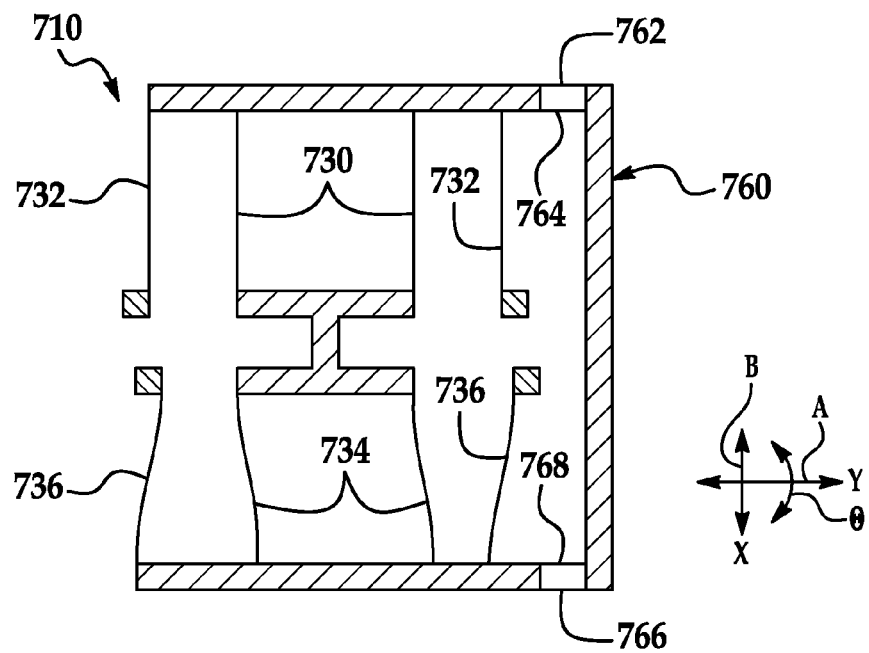
FIG. 18 is a diagrammatic view of a seventh embodiment of a flexure bearing configuration.

FIG. 18 shows a seventh embodiment of a flexure bearing configuration 710. The flexure bearing configuration 710 is similar in some ways to the flexure bearing configuration 510 of the fifth embodiment, and descriptions of these similarities will not necessarily be repeated for the seventh embodiment. Furthermore, potential modifications to the seventh embodiment are the same as those for the fifth embodiment. In this embodiment, a first and second pair of flexure beams 730, 732 have a geometrically straight design, and a third and fourth pair of flexure beams 734, 736 have a pre-bent design. Performances of these designs have previously been described. Again here, a rigid connector 760 is provided, and, flexure beams 762, 764, 766, 768, have a geometrically straight design.

Figure 19:
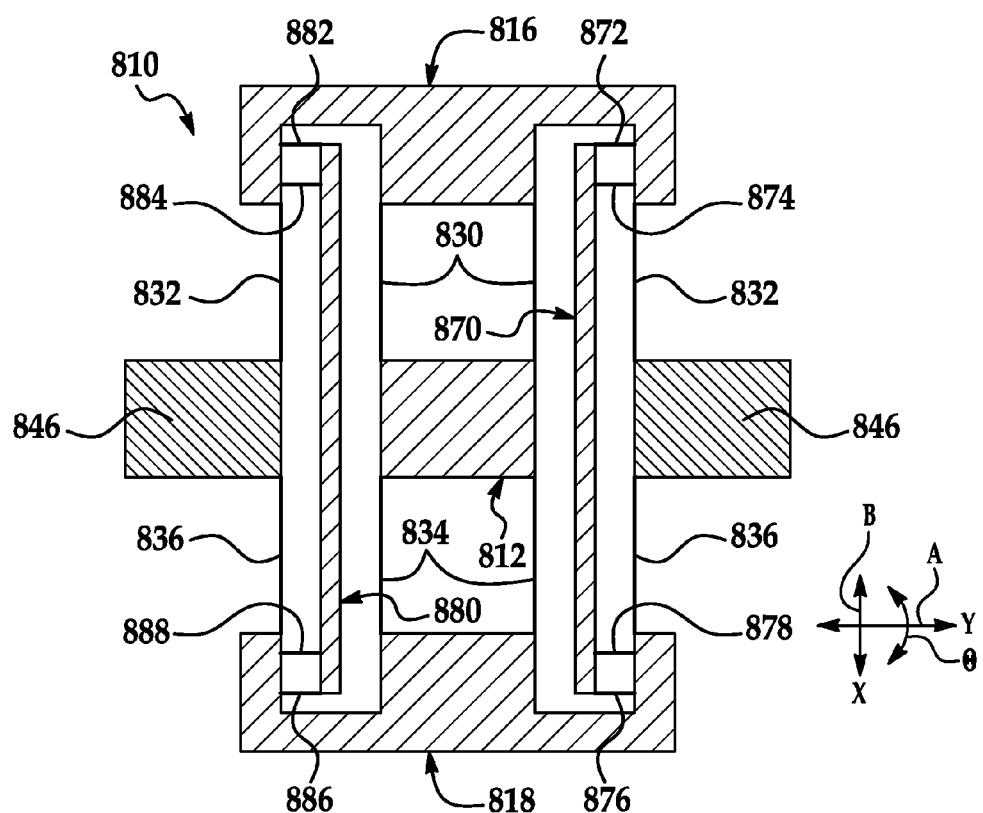
FIG. 19 is a diagrammatic view of an eighth embodiment of a flexure bearing configuration.

FIG. 19 shows an eighth embodiment of a flexure bearing configuration 810. The flexure bearing configuration 810 is similar in some ways to the flexure bearing configuration 510 of the fifth embodiment, and descriptions of these similarities will not necessarily be repeated for the eighth embodiment. Furthermore, potential modifications to the eighth embodiment are the same as those for the fifth embodiment.

Figure 22:
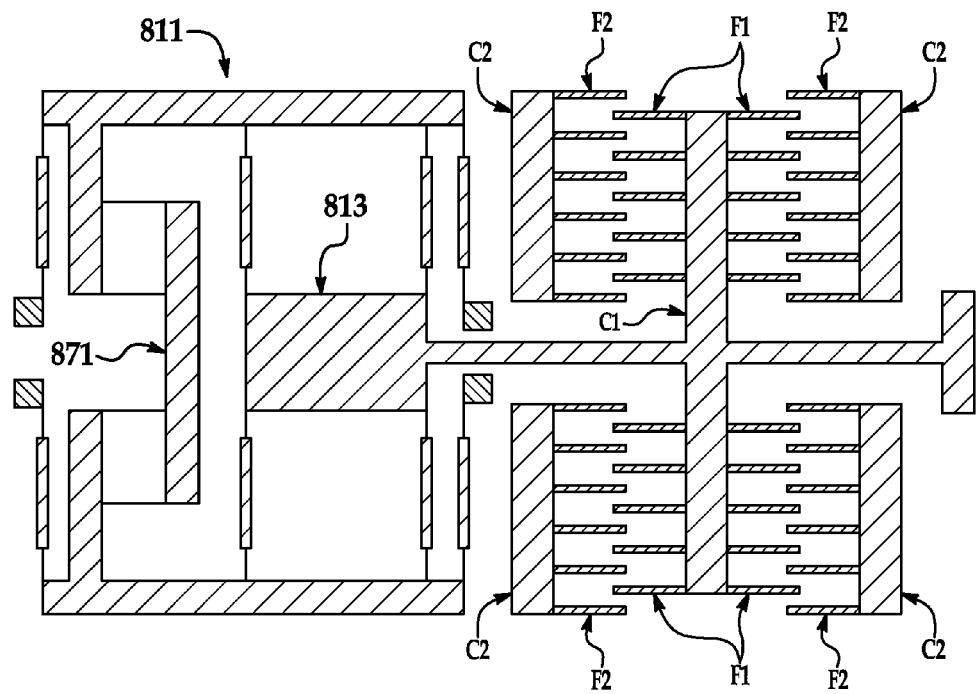
FIG. 22 is a diagrammatic view of another embodiment of a flexure bearing configuration and an embodiment of an electrostatic comb-drive actuator.

In this embodiment, at rest, a first and second pair of flexure beams 830, 832 have a geometrically straight design, and a third and fourth pair of flexure beams 834, 836 also have a geometrically straight design. The second and fourth pair of flexure beams 832, 836 are coupled to a ground 846. A first rigid connector 870 is coupled between a first secondary mover 816 and a second secondary mover 818, and joins their respective secondary motion stages. The first connector 870 is not itself directly anchored to a ground and is not connected to a ground via a single flexure connection, and is free to move during actuation and movement of a primary mover 812. The first connector 870 is coupled to the first secondary mover 816 via a first individual flexure beam 872 and a second individual flexure beam 874, and is coupled to the second secondary mover 818 via a third individual flexure beam 876 and via a fourth individual flexure beam 878. Similarly, a second rigid connector 880 is coupled between the first secondary mover 816 and the second secondary mover 818, and joins their respective secondary motion stages. The second connector 880 is not itself directly anchored to a ground and is not connected to a ground via a single flexure connection, and is free to move during actuation and movement of the primary mover 812. The second connector 880 is coupled to the first secondary mover 816 via a fifth individual flexure beam 882 and via a sixth individual flexure beam 884, and is coupled to the second secondary mover 818 via a seventh individual flexure beam 886 and via an eighth individual flexure beam 888. Other couplings to the secondary movers are possible, as previously described. Referring now to FIG. 22, a modification of the eighth embodiment is shown in use with the example electrostatic comb-drive actuator. In this modification, a flexure bearing configuration 811 only includes a single rigid connector 871, a primary mover 813 is a unitary extension of the moveable first comb C1, and all of the flexure beams have beam variation similar to that shown in FIG. 21.

Figure 20:
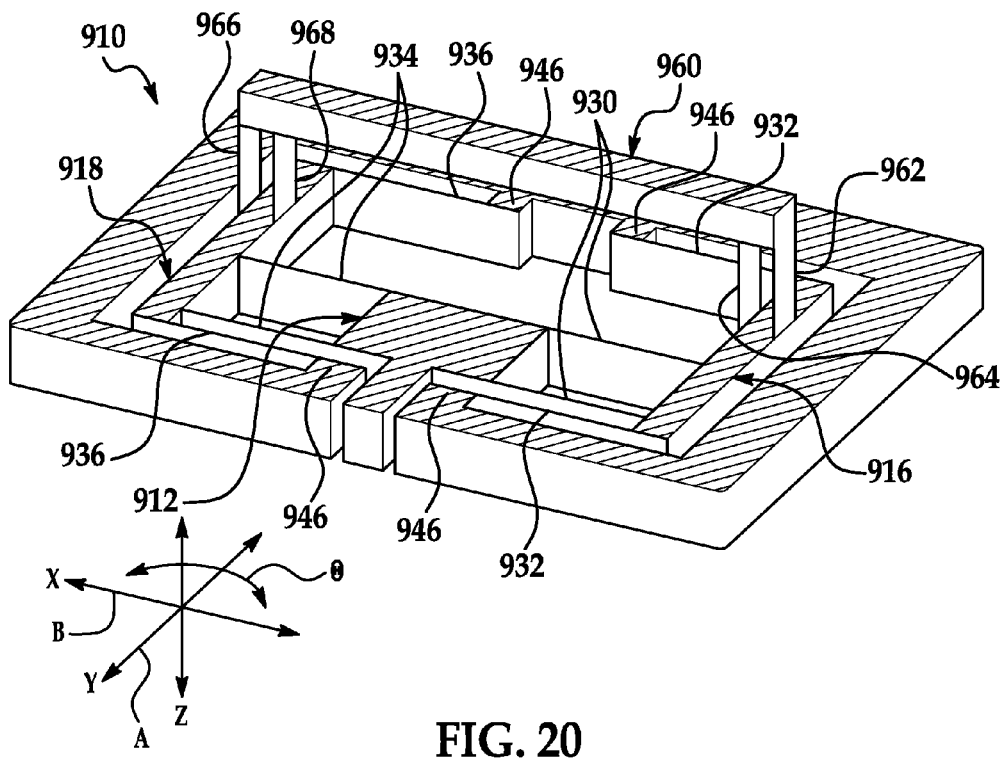
FIG. 20 is a diagrammatic view of a ninth embodiment of a flexure bearing configuration.

FIG. 20 shows a ninth embodiment of a flexure bearing configuration 910. The flexure bearing configuration 910 is similar in some ways to the flexure bearing configuration 510 of the fifth embodiment, and descriptions of these similarities will not necessarily be repeated for the ninth embodiment. Furthermore, potential modifications to the ninth embodiment are the same as those for the fifth embodiment. In this embodiment, a first and second pair of flexure beams 930, 932 have a geometrically straight design, and a third and fourth pair of flexure beams 934, 936 also have a geometrically straight design. The second and fourth pair of flexure beams 932, 936 are coupled to a ground 946. A rigid connector 960 is coupled between a first secondary mover 916 and a second secondary mover 918, and joins their respective secondary motion stages. The connector 960 is not itself directly anchored to a ground and is not connected to a ground via a single flexure connection, and is free to move during actuation and movement of a primary mover 912. In this embodiment, the connector 960 has an out-of-plane configuration in which the connector resides in a different z-axis plane than that of other components of the flexure bearing configuration 910 such as the first and second secondary movers 916, 918 and the primary mover 912. The connector 960 is coupled to the first secondary mover 916 via a first individual flexure beam 962 and a second individual flexure beam 964, and is coupled to the second secondary mover 918 via a third individual flexure beam 966 and a fourth individual flexure beam 968. In this embodiment, the flexure beams 962, 964, 966, 968 have geometrically straight designs and are directed out-of-plane and in the z-axis. Other couplings to the secondary movers are possible, as previously described. The out-of-plane connector configuration could be incorporated in other embodiments that use a rigid connector, including the fifth, sixth, seventh, and eighth embodiments.

Figure 23:
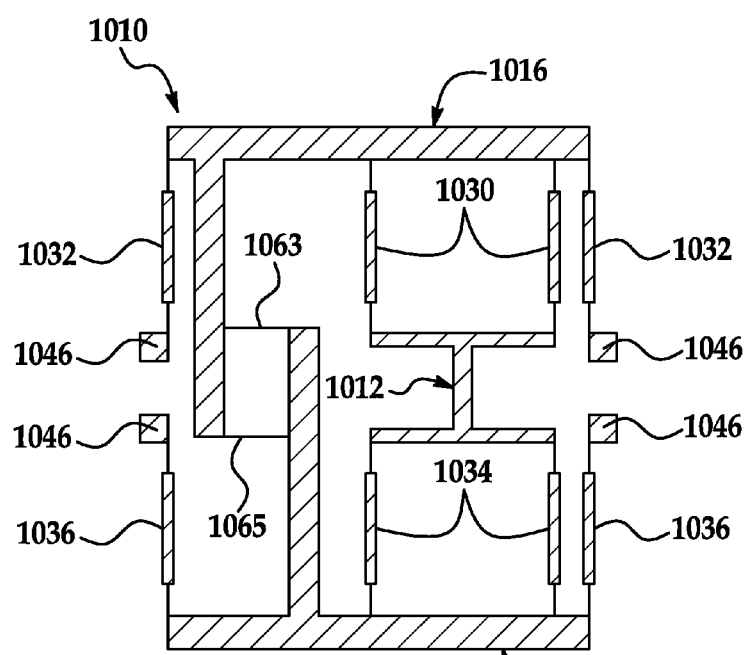
FIG. 23 is a diagrammatic view of a tenth embodiment of a flexure bearing configuration.

FIG. 23 shows a tenth embodiment of a flexure bearing configuration 1010. The flexure bearing configuration 1010 is similar in some ways to the flexure bearing configuration 510 of the fifth embodiment, and descriptions of these similarities may not necessarily be repeated for the tenth embodiment. In this embodiment, a first and third pair of flexure beams 1030 and 1034 that are coupled to a primary mover 1012 have a geometrically straight design but have beam variation similar to that described with reference to FIG. 21. Likewise, a second and fourth pair of flexure beams 1032 and 1036 coupled between a first and second secondary mover 1016 and 1018 and ground 1046 have a geometrically straight design but have beam variation similar to that described with reference to FIG. 21. Unlike previous embodiments shown, in the tenth embodiment the first and second secondary movers 1016, 1018 can be coupled to each via one or more flexure connections—in this specific example, individual flexure beams 1063 and 1065. Other couplings between the first and second secondary movers 1016, 1018 are possible including, for example, increasing the number of individual flexure beams to three or four. The flexure beams 1063, 1065 have a geometrically straight design, but could also have a pre-bent design. Furthermore, the flexure beams 1063, 1065 have a length sufficient to permit free movement of the first and second secondary movers 1016, 1018 along the bearing axis B and that does not substantially constrain movement of the first and second secondary movers along the bearing axis that can otherwise occur upon movement of the primary mover 1012. The exact shape (i.e., uniform thickness versus variable thickness), geometry (i.e., straight versus pre-bent), dimensions of the individual flexure beams 1063, 1065, and spacing between individual flexure beams can vary among different applications. And, like the seventh modification previously described, the lengths of the individual flexures beams 1063, 1065 could differ with respect to each other. Lastly, as previously described, in use in the tenth embodiment the displacement along the motion axis of the secondary motion stages is approximately one-half that of the primary motion stage and remains substantially one-half throughout movement of the secondary and primary motion stages even when the primary mover is loaded in the bearing direction B.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A flexure bearing configuration, comprising:
a primary mover guided for movement along a motion axis;
a first flexure connection coupled to said primary mover;
a first secondary mover guided for movement along the motion axis and coupled to said first flexure connection;
a second flexure connection coupled to said first secondary mover, said second flexure connection being anchored at a ground;
a third flexure connection coupled to said primary mover;
a second secondary mover guided for movement along the motion axis and coupled to said third flexure connection; and a fourth flexure connection coupled to said second secondary mover, said fourth flexure connection being anchored at said ground;

wherein, during use, a displacement along the motion axis of said first secondary mover, of said second secondary mover, or of both said first and second secondary movers, is approximately one-half a displacement along the motion axis of said primary mover, and the displacement of said first secondary mover, of said second secondary mover, or of both said first and second secondary movers, remains approximately one-half throughout movement of said primary mover during use of the flexure bearing configuration; and wherein said primary mover is free of a direct coupling to a flexure connection that is not directly coupled to a secondary mover.

2. A flexure bearing configuration as defined in claim 1, wherein all flexure connections coupled directly to said primary mover are directed geometrically nonparallel with respect to the motion axis when the primary mover is not moving along the motion axis.

3. A flexure bearing configuration as defined in claim 1, further comprising a plurality of secondary movers coupled to said primary mover via flexure connections and coupled to said ground via flexure connections.

4. A flexure bearing configuration as defined in claim 1, wherein, during use, a displacement along the motion axis of both of said first and second secondary movers is approximately one-half a displacement along the motion axis of said primary mover, and the displacement of both of said first and second secondary movers remains approximately one-half throughout movement of said first and second secondary movers and throughout movement of said primary mover during use of the flexure bearing configuration.

5. A flexure bearing configuration as defined in claim 1, wherein said first, second, third, and fourth flexure connections each comprise at least a first and second flexure beam.

6. A flexure bearing configuration as defined in claim 5, wherein said at least first and second flexure beams of said first and second flexure connections have a tilted design in which said first and second flexure beams of said first flexure connection are geometrically nonparallel with respect to a bearing axis and said first and second flexure beams of said first flexure connection are geometrically nonparallel relative to each other, and in which said first and second flexure beams of said second flexure connection are geometrically nonparallel with respect to the bearing axis and said first and second flexure beams of said second flexure connection are geometrically nonparallel relative to each other, and wherein said at least first and second flexure beams of said third and fourth flexure connections have a geometrically straight design.

7. A flexure bearing configuration as defined in claim 5, wherein said at least first and second flexure beams of said first and second flexure connections have a pre-bent design, and said at least first and second flexure beams of said third and fourth flexure connections have a pre-bent design.

8. A flexure bearing configuration as defined in claim 5, wherein at least some of said first and second flexure beams of said first, second, third, and fourth flexure connections have a varying shape along their lengths.

9. A flexure bearing configuration as defined in claim 5, wherein in at least some of said first and second flexure beams of said first, second, third, and fourth flexure connections, said first flexure beam has a first length, said second flexure beam has a second length, and said first length has a different value than said second length.

10. A flexure bearing configuration as defined in claim 1, further comprising a rigid connector coupled to said first secondary mover via a fifth flexure connection and coupled to said second secondary mover via a sixth flexure connection.

11. A flexure bearing configuration as defined in claim 10, wherein said rigid connector is free of a direct coupling to said ground.

12. A flexure bearing configuration as defined in claim 10, wherein said fifth and sixth flexure connections each comprise at least a first and second flexure beam.

13. A flexure bearing configuration as defined in claim 12, wherein said first, second, third, and fourth flexure connections each comprise at least a first and second flexure beam.

14. A flexure bearing configuration as defined in claim 13, wherein said at least first and second flexure beams of said first and second flexure connections have a pre-bent design, and said at least first and second flexure beams of said third and fourth flexure connections have a pre-bent design.

15. A flexure bearing configuration as defined in claim 13, wherein said at least first and second flexure beams of said first and second flexure connections have a geometrically straight design, and said at least first and second flexure beams of said third and fourth flexure connections have a pre-bent design.

16. A flexure bearing configuration as defined in claim 10, wherein said fifth and sixth flexure connections do not substantially constrain movement of said first and second secondary movers along a bearing axis.

17. A flexure bearing configuration as defined in claim 10, further comprising a second rigid connector coupled to said first secondary mover via a seventh flexure connection and coupled to said second secondary mover via an eighth flexure connection.

18. A flexure bearing configuration as defined in claim 17, wherein said seventh and eighth flexure connections each comprise at least a first and second flexure beam.

19. A flexure bearing configuration as defined in claim 17, wherein said seventh and eighth flexure connections do not substantially constrain movement of said first and second secondary movers along a bearing axis.

20. A flexure bearing configuration as defined in claim 1, wherein said first secondary mover and said second secondary mover are coupled to each other via a fifth flexure connection.

21. An electrostatic comb-drive actuator comprising the flexure bearing configuration as defined in claim 1.

22. An electromagnetic actuator comprising the flexure bearing configuration as defined in claim 1.

23. A flexure bearing configuration, comprising:
a primary mover guided for movement along a motion axis;
a first flexure connection coupled to said primary mover;
a first secondary mover guided for movement along the motion axis and coupled to said first flexure connection;
a second flexure connection coupled to said first secondary mover, said second flexure connection being anchored at a ground;
a third flexure connection coupled to said primary mover;
a second secondary mover guided for movement along the motion axis and coupled to said third flexure connection;
a fourth flexure connection coupled to said second secondary mover, said fourth flexure connection being anchored at said ground; and
a rigid connector coupled to said first secondary mover via a fifth flexure connection and coupled to said second secondary mover via a sixth flexure connection, said rigid connector being free of a direct coupling to said primary mover and being free of a direct coupling to said ground.

24. A flexure bearing configuration as defined in claim 23, wherein said first, second, third, fourth, fifth, and sixth flexure connections each comprise at least a first and second flexure beam.

25. A flexure bearing configuration as defined in claim 24, wherein said at least first and second flexure beams of said first and second flexure connections have a pre-bent design, and said at least first and second flexure beams of said third and fourth flexure connections have a pre-bent design.

26. A flexure bearing configuration as defined in claim 24, wherein said at least first and second flexure beams of said first and second flexure connections have a geometrically straight design, and said at least first and second flexure beams of said third and fourth flexure connections have a pre-bent design.

27. A flexure bearing configuration as defined in claim 24, wherein at least some of said first and second flexure beams of said first, second, third, and fourth flexure connections have a varying shape along their lengths.

28. A flexure bearing configuration as defined in claim 23, wherein said fifth and sixth flexure connections do not substantially constrain movement of said first and second secondary movers along a bearing axis.

29. A flexure bearing configuration as defined in claim 23, further comprising a second rigid connector coupled to said first secondary mover via a seventh flexure connection and coupled to said second secondary mover via an eighth flexure connection.

30. A flexure bearing configuration as defined in claim 29, wherein said seventh and eighth flexure connections each comprise at least a first and second flexure beam.

31. A flexure bearing configuration as defined in claim 29, wherein said seventh and eighth flexure connections do not substantially constrain movement of said first and second secondary movers along a bearing axis.

32. A flexure bearing configuration, comprising:
a primary mover guided for movement along a motion axis;
a first flexure connection coupled to said primary mover;
a first secondary mover guided for movement along the motion axis and coupled to said first flexure connection;
a second flexure connection coupled to said first secondary mover, said second flexure connection being anchored at a ground;
a third flexure connection coupled to said primary mover;
a second secondary mover guided for movement along the motion axis and coupled to said third flexure connection;
a fourth flexure connection coupled to said second secondary mover, said fourth flexure connection being anchored at said ground; and
at least an additional secondary mover coupled to said primary mover via an additional flexure connection and anchored to said ground via yet another additional flexure connection.

33. A flexure bearing configuration as defined in claim 32, wherein said first, second, third, and fourth flexure connections each comprise at least a first and second flexure beam.

34. A flexure bearing configuration as defined in claim 33, wherein said at least first and second flexure beams of said first, second, third, and fourth flexure connections have a pre-bent design.

35. A flexure bearing configuration as defined in claim 33, wherein said at least first and second flexure beams of said first, second, third, and fourth flexure connections have a varying shape along their lengths.

* * * * *